US007221298B1

(12) United States Patent
Persons

(10) Patent No.: US 7,221,298 B1
(45) Date of Patent: May 22, 2007

(54) CALIBRATION CIRCUITRY

(75) Inventor: Thomas W. Persons, Los Altos, CA (US)

(73) Assignee: Teradyne, Inc., North Reading, MA (US)

( * ) Notice: Subject to any disclaimer, the term of this patent is extended or adjusted under 35 U.S.C. 154(b) by 0 days.

(21) Appl. No.: 11/297,726

(22) Filed: Dec. 8, 2005

(51) Int. Cl.
H03M 1/10 (2006.01)

(52) U.S. Cl. ............... 341/120; 341/118; 341/141; 341/144

(58) Field of Classification Search ............ 341/118, 341/120
See application file for complete search history.

(56) References Cited

U.S. PATENT DOCUMENTS 4,814,872 A * 3/1989 Ivie ..................... 348/184
6,492,798 B2 * 12/2002 Sunter .................. 324/76.15
6,624,772 B1 * 9/2003 Gealow et al. ............ 341/120
6,703,820 B2 * 3/2004 Sunter .................. 324/76.15
6,836,227 B2 * 12/2004 Asami .................... 341/118
2005/0135524 A1 * 6/2005 Messier .................. 375/354

* cited by examiner

Primary Examiner—Khai M. Nguyen
(74) Attorney, Agent, or Firm—Fish & Richardson P.C.

(57) ABSTRACT

Circuitry includes a multiplexer to output first data and second data in response to a clock signal, the clock signal having rising and falling clock edges, where the multiplexer outputs first data at a rising clock edge and outputs second data at a falling clock edge. The circuitry includes a DAC to receive the first data and the second data and to generate, therefrom, complementary first and second signals, a filter to filter the complementary first signals and second signals and thereby produce first and second filtered signals, and a voltmeter to measure a difference between the first and second filtered signals, the difference corresponding to a duty cycle error in the clock signal.

28 Claims, 4 Drawing Sheets

CALIBRATION CIRCUITRY

TECHNICAL FIELD

This patent application relates generally to circuitry for calibrating the output of a digital-to-analog converter (DAC).

BACKGROUND

Automatic test equipment (ATE) refers to an automated, usually computer-driven, system for testing devices, such as semiconductors, electronic circuits, and printed circuit board assemblies. A device tested by ATE is referred to as a device under test (DUT).

ATE is capable of providing different types of signals to a DUT. Among these signals are test signals, which are used to test the DUT. The test signals may be analog signals that are generated based on digital signals received from a computer or other processing device. A digital-to-analog converter (DAC) (or several DACs) in the ATE is typically used to perform conversion(s) from digital to analog.

A DAC produces an analog signal by sampling a digital signal. A DAC may sample the digital signal using one edge of a clock—the rising or falling edge—or both edges of the clock. Sampling using both edges means that the digital signal is sampled at both the rising and falling edges of the clock. This type of sampling produces a higher sampling rate, and thus a more accurate analog signal. Sampling using both edges of the clock, however, can be quite sensitive to duty cycle errors in the clock.

The duty cycle of a clock is a ratio of the amount of time that the clock is high to the time of one clock cycle. In some systems, an error in the duty cycle occurs if the ratio is anything other than 50%, meaning that the clock is high half of the time and low half of the time. For DACs that sample using both edges of the clock, an error in the duty cycle can result in frequency spurs in output analog signals.

SUMMARY

This patent application describes methods and apparatus, including computer program products, for calibrating the output of a circuit, such as a DAC in ATE.

In general, in one aspect, the invention is directed to circuitry that includes a multiplexer to output first data and second data in response to a clock signal, where the clock signal has rising and falling clock edges, and the multiplexer outputs first data at a rising clock edge and outputs second data at a falling clock edge. A digital-to-analog converter (DAC) receives the first data and the second data and generates, therefrom, complementary first and second signals. A filter filters the complementary first signals and second signals and thereby produces first and second filtered signals. A voltmeter measures a difference between the first and second filtered signals. The voltage difference is used in a procedure to obtain and correct for a duty cycle error in the clock signal. This aspect of the invention may also include one or more of the following features.

The filter may be a lowpass filter. The first data and the second data each may include n-bit values, where n>1, that correspond to analog voltage levels. Clock generating circuitry may be used to generate the clock signal. A controller may be used to adjust the clock generating circuitry to substantially compensate for the duty cycle error. The controller may adjust the clock generating circuitry to change the duty cycle of the clock signal. The controller may adjust the clock generating circuitry plural times in order to reduce the duty cycle error. Adjusting the clock generating circuitry plural times may substantially compensate for errors in the duty cycle introduced by the DAC. A tracking circuit may be used to identify a second duty cycle error in the clock signal that was introduced as a result of a change in an operating condition associated with the circuitry, and to substantially compensate for the second duty cycle error. The tracking circuit may include one or more of the following: a multiplexer to output third data and fourth data in response to the clock signal, where the multiplexer outputs third data at a rising clock edge and outputs fourth data at a falling clock edge; a DAC to receive the third data and the fourth data and to output complementary third signals and fourth signals; a lowpass filter to filter the complementary third signals and fourth signals and thereby produce third and fourth filtered signals; and a voltmeter to measure a difference between the third and fourth filtered signals, where the difference corresponds to the second duty cycle error. The third data may include single-bit values having a first voltage level, and the fourth data may include single-bit values having a second voltage level, where the first and second voltage levels are different. The operating condition may include at least one of temperature and voltage applied to power the circuitry.

In general, in another aspect, the invention is directed to a method of calibrating a DAC, which includes outputting first data and second data to the DAC in response to a clock signal having rising and falling clock edges, where the first data is output at a rising clock edge and the second data is output at a falling clock edge. The method also includes generating complementary first signals and second signals via the DAC, where the complementary first signals and second signals are generated based on the first and second data, respectively, filtering the complementary first signals and second signals to produce first and second filtered signals, obtaining a difference between the first and second filtered signals, and adjusting a duty cycle of the clock signal based on the difference. This aspect of the invention may also include one or more of the following.

Filtering may be performed by lowpass filtering. The first data and the second data each may include n-bit values, where n>1, that correspond to analog voltage levels. The duty cycle may be adjusted in order to reduce an error in the duty cycle. The duty cycle may be adjusted plural times in order to substantially compensate for the error in the duty cycle. Adjusting the duty cycle plural times may substantially compensate for errors in the duty cycle introduced by the DAC. The method may also include identifying a second duty cycle error in the clock signal that was introduced as a result of a change in an operating condition associated with the method, and substantially compensating for the second duty cycle error. Identifying the second duty cycle error may include outputting third data and fourth data in response to the clock signal, where the multiplexer outputs third data at a rising clock edge and outputs fourth data at a falling clock edge; generating complementary third signals and fourth signals based on the third data and the fourth data, respectively; filtering the complementary third signals and fourth signals to thereby produce third and fourth filtered signals; and measuring a difference between the third and fourth filtered signals, where the difference corresponds to the second duty cycle error. The third data may include single-bit values having a first voltage level, and the fourth data may include single-bit values having a second voltage level, where the first and second voltage levels are different. The operating condition may include at least one of temperature and voltage applied to power the method.

DESCRIPTION OF THE DRAWINGS

Like reference numerals in different figures indicate like elements.

DETAILED DESCRIPTION

Figure 1:
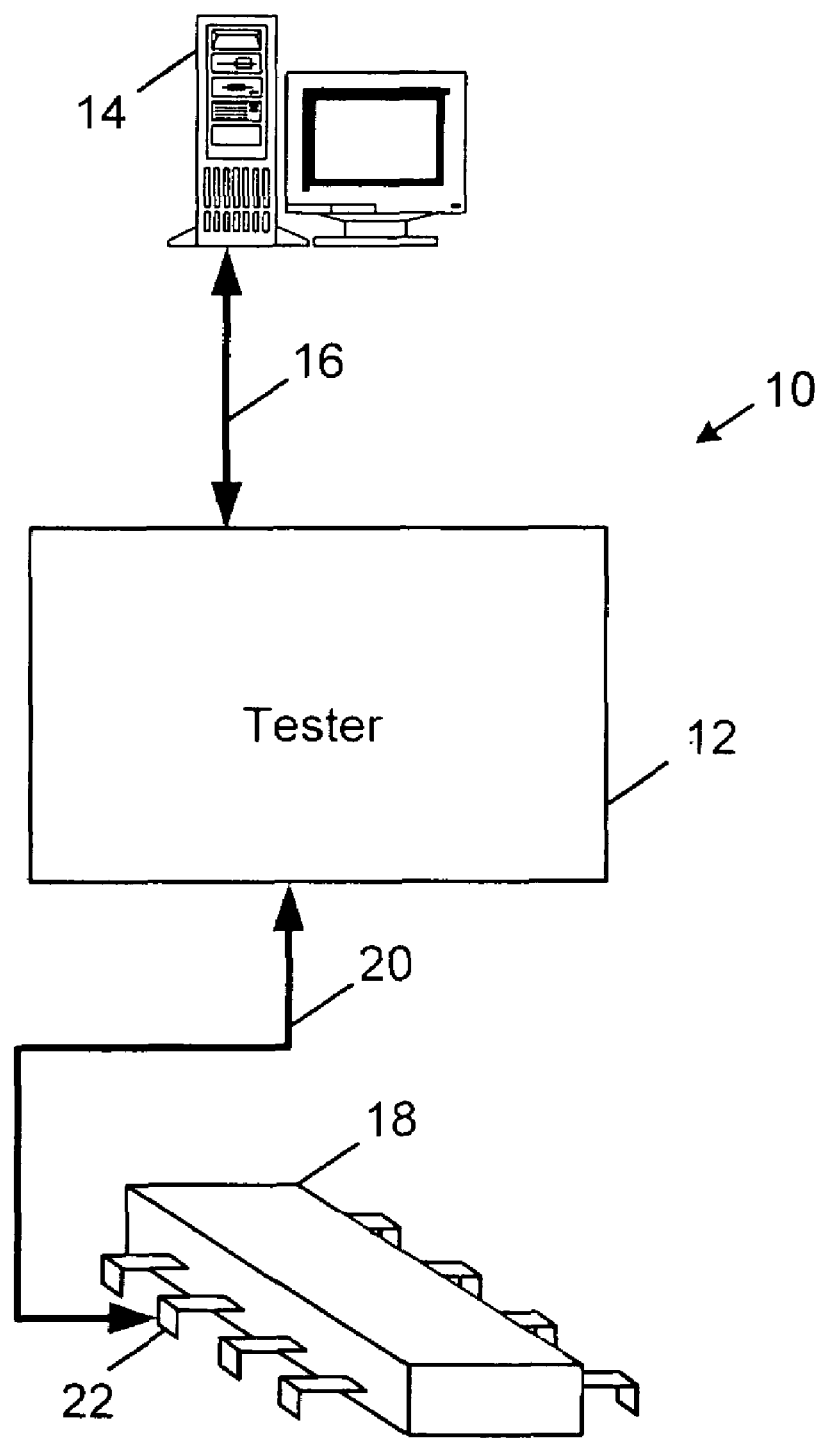
FIG. 1 is a block diagram of ATE for testing devices.

Referring to FIG. 1, a system 10 for testing a device-under-test (DUT) 18, such as a semiconductor device, includes a tester 12 such as automatic test equipment (ATE) or other similar testing device. To control tester 12, system 10 includes a computer system 14 that interfaces with tester 12 over a hardwire connection 16. Typically, computer system 14 sends commands to tester 12 that initiate the execution of routines and functions for testing DUT 18. Such executing test routines may initiate the generation and transmission of test signals to the DUT 18 and collection of responses from the DUT. Various types of DUTs may be tested by system 10. For example, DUTs may be semiconductor devices, such as an integrated circuit (IC) chip (e.g., memory chip, microprocessor, analog-to-digital converter, digital-to-analog converter, etc.).

To provide test signals and collect responses from the DUT, tester 12 is connected to one or more connector pins that provide an interface for the internal circuitry of DUT 18. To test some DUTs, e.g., as many as sixty-four or one hundred twenty-eight connector pins (or more) may be interfaced to tester 12. For illustrative purposes, in this example, semiconductor device tester 12 is connected to one connector pin of DUT 18 via a hardwire connection. A conductor 20 (e.g., cable) is connected to pin 22 and is used to deliver test signals (e.g., PMU test signals, PE test signals, etc.) to the internal circuitry of DUT 18. Conductor 20 also senses signals at pin 22 in response to the test signals provided by semiconductor device tester 12. For example, a voltage signal or a current signal may be sensed at pin 22 in response to a test signal and sent over conductor 20 to tester 12 for analysis. Such single port tests may also be performed on other pins included in DUT 18. For example, tester 12 may provide test signals into other pins and collect associated signals reflected back over conductors (that deliver the provided signals). By collecting the reflected signals, the input impedance of the pins may be characterized, along with other single port testing quantities. In other test scenarios, a digital signal may be sent over conductor 20 to pin 22 for storing a digital value on DUT 18. Once stored, DUT 18 may be accessed to retrieve and send the stored digital value over conductor 20 to tester 12. The retrieved digital value may then be identified to determine if the proper value was stored on DUT 18.

Along with performing one-port measurements, a two-port test may also be performed by semiconductor device tester 12. For example, a test signal may be injected over conductor 20 into pin 22 and a response signal may be collected from one or more other pins of DUT 18. This response signal may be provided to semiconductor device tester 12 to determine such quantities as gain response, phase response, and other throughput measurement quantities.

Figure 2:
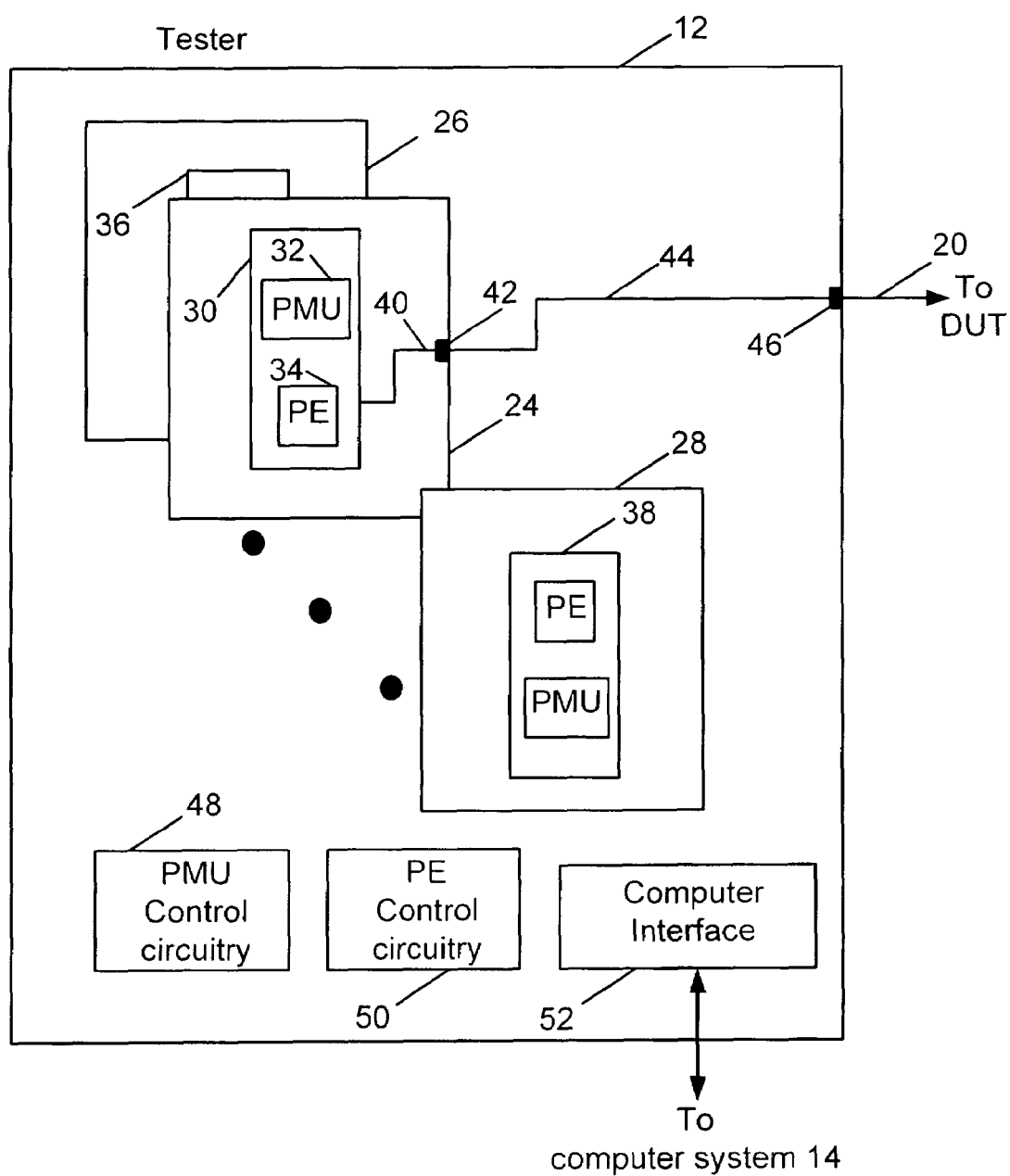
FIG. 2 is a block diagram of a tester used in the ATE.

Referring also to FIG. 2, to send and collect test signals from multiple connector pins of a DUT (or multiple DUTs), semiconductor device tester 12 includes an interface card 24 that can communicate with numerous pins. For example, interface card 24 may transmit test signals to, e.g., 32, 64, or 128 pins and collect corresponding responses. Each communication link to a pin is typically referred to as a channel and, by providing test signals to a large number of channels, testing time is reduced since multiple tests may be performed simultaneously. Along with having many channels on an interface card, by including multiple interface cards in tester 12, the overall number of channels increases, thereby further reducing testing time. In this example, two additional interface cards 26 and 28 are shown to demonstrate that multiple interface cards may populate tester 12.

Each interface card includes a dedicated integrated circuit (IC) chip (e.g., an application specific integrated circuit (ASIC)) for performing particular test functions. For example, interface card 24 includes IC chip 30 for performing parametric measurement unit (PMU) tests and pin electronics (PE) tests. IC chip 30 has a PMU stage 32 that includes circuitry for performing PMU tests and a PE stage 34 that includes circuitry for performing PE tests. Additionally, interface cards 26 and 28 respectively include IC chips 36 and 38 that include PMU and PE circuitry. Typically PMU testing involves providing a DC voltage or current signal to the DUT to determine such quantities as input and output impedance, current leakage, and other types of DC performance characterizations. PE testing involves sending AC test signals and waveforms to a DUT (e.g., DUT 18) and collecting responses to further characterize the performance of the DUT. For example, IC chip 30 may transmit, to the DUT, AC test signals that represent a vector of binary values for storing on the DUT. Once these binary values have been stored, the DUT is accessed by tester 12 to determine if the correct binary values have been stored. Since digital signals typically include abrupt voltage transitions, the circuitry in PE stage 34 on IC chip 30 operates at a relatively high speed in comparison to the circuitry in PMU stage 32.

To pass both DC and AC test signals and analog waveforms from interface card 24 to DUT 18, a conducting trace 40 connects IC chip 30 to an interface board connector 42 that allows signals to be passed on and off interface board 24. Interface board connector 42 is also connected to a conductor 44 that is connected to an interface connector 46, which allows signals to be passed to and from tester 12. In this example conductor 20 is connected to interface connector 46 for bi-directional signal passing between tester 12 and pin 22 of DUT 18. In some arrangements, an interface device may be used to connect one or more conductors from tester 12 to the DUT. For example, the DUT (e.g., DUT 18) may be mounted onto a device interface board (DIB) for providing access to each DUT pin. In such an arrangement, conductor 20 may be connected to the DIB for placing test signals on the appropriate pin(s) (e.g., pin 22) of the DUT.

In this example, only conducting trace 40 and conductor 44 respectively connect IC chip 30 and interface board 24 for delivering and collecting signals. However, IC chip 30 (along with IC chips 36 and 38) typically has multiple pins (e.g., eight, sixteen, etc.) that are respectively connected with multiple conducting traces and corresponding conductors for providing and collecting signals from the DUT (via a DIB). Additionally, in some arrangements, tester 12 may connect to two or more DIB's for interfacing the channels provided by interface cards 24, 26, and 28 to one or multiple devices under test.

To initiate and control the testing performed by interface cards 24, 26, and 28, tester 12 includes PMU control circuitry 48 and PE control circuitry 50 that provide test parameters (e.g., test signal voltage level, test signal current level, digital values, etc.) for producing test signals and analyzing DUT responses. PMU control circuitry 48 and PE control circuitry 50 may be part of one or more ICs or may be implemented via a processing device, such as a digital signal processor (DSP). Tester 12 also includes a computer interface 52 that allows computer system 14 to control the operations executed by tester 12 and also allows data (e.g., test parameters, DUT responses, etc.) passing between tester 12 and computer system 14.

Figure 3:
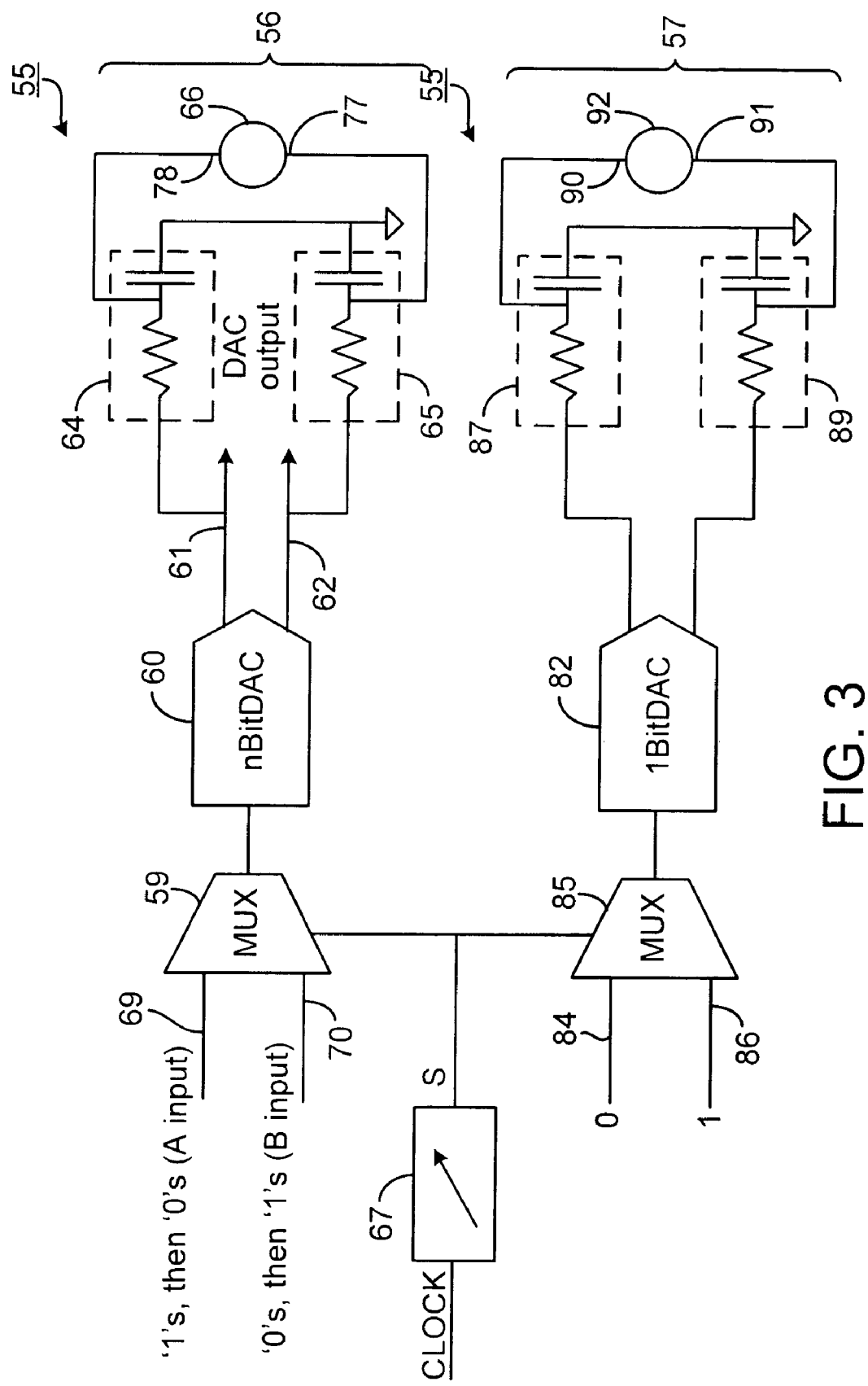
FIG. 3 is a diagram of DAC calibration circuitry for use with the ATE.

FIG. 3 shows circuitry 55 that may be incorporated into interface cards 24, 26, and 28 to generate analog signals for output from tester 12 to a DUT. Circuitry 55 is used to calibrate the output of a DAC that generates the analog signals. Circuitry 55 includes a first stage 56 for calibrating the DAC output prior to operation of the ATE, and a second stage 57 for calibrating the DAC output during operation of the ATE (e.g., to compensate for duty cycle errors resulting in changes in operational conditions, such as changes in temperature and fluctuations in voltage used to power the ATE).

First stage 56 and second stage 57 include similar circuitry, and are similar in operation, as explained below. Referring to the upper portion of circuitry 55, in this implementation, first stage 56 includes a multiplexer 59, an n-bit DAC 60 (where $n \geq 1$) having complementary outputs 61 and 62, filters 64 and 65, and voltmeter 66.

A clock generating circuit 67 provides a square wave clock signal, which controls multiplexer 59. In this implementation, the clock signal has a period of 1 gigahertz (GHz); however, a clock signal of any period may be used. Multiplexer 59 samples data from its A-input 69 at the rising edge of the clock signal and samples data from its B-input 70 at the falling edge of the clock signal. Because the clock signal has a period of 1 GHz, and sampling occurs twice per period, sampling occurs every 500 picoseconds (PS). The sampling is used in a calibration process 71 (FIG. 4) to calibrate the duty cycle error of the sampled output of DAC 60. In this regard, as explained below, DAC 60 provides a square wave output to first filter 64 and second filter 65. The square wave output includes first and second complementary signals.

First filter 64 produces an average of the first signal over time, and second filter 65 produces an average of the second signal (the complement of the first signal) over time. If the circuitry were ideal, and the clock duty cycle were 50%, the difference between filter outputs/voltmeter inputs 77 and 78 would be zero. However, there are mismatches between elements inside DAC 60 and MUX 59 as well as the input clock duty cycle errors, etc., which cause outputs 77 and 78 to be different. What is needed is an adjustment method that will only adjust for duty cycle errors and reject effects due to circuit differences. The calibration procedure, outlined in FIG. 4, addresses this need.

Figure 4:
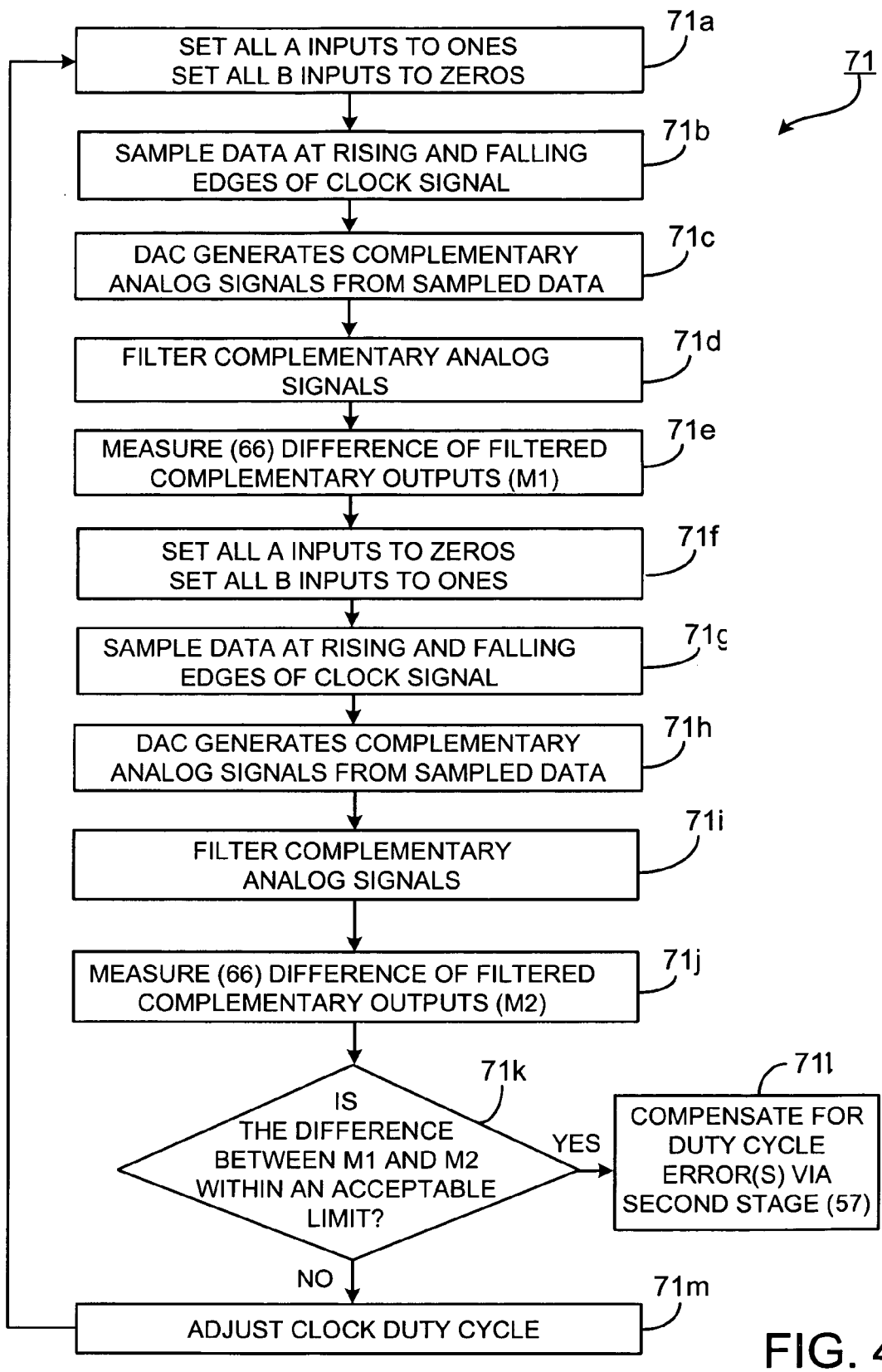
FIG. 4 is a flowchart showing a process that may be performed using the DAC calibration circuitry.

Referring to FIG. 4, to calibrate DAC 60, data having known values is provided to A-input 69 and B-input 70. The data may be provided by a processing device, such as a DSP. Each set of ten-bit data represents an analog voltage level to be output by DAC 60. That is, in this implementation, DAC 60 is a 10-bit DAC, and is therefore capable of producing an output of $2^{10}$, or 1024, analog voltage levels. In this case, initially, A-inputs 69 are set to all ones and B-inputs 70 are set to all zeros (71a). Multiplexer 59 samples A-input data when clock signal "S" (hereinafter, "the clock") is high and B-input data when clock is low (71b). DAC 60 generates (71c) complementary analog square wave signals from the sampled data. (In this case, output 61 remains high for a longer period of time than when the clock is low if clock duty cycle errors are greater than 50%, and output 62 remains low for a longer period of time than when the clock is high). Filters 64 and 65 filter (71d) the complementary analog square wave signals to produce filtered signals. These filtered signals are applied to the inputs 77, 78 of voltmeter 66.

After the clock is allowed to toggle, and after filters 64 and 65 settle, voltmeter 66 measures (71e) the difference between the signals at inputs 77 and 78. This measurement is stored (e.g., in memory, not shown) as measurement M1. In this implementation, M1 is a measure of all sources of duty cycle error, including, but not limited to, the clock duty cycle error, DAC circuitry mismatches, and interconnect resistance.

To reduce duty cycle effects from sources other than clock duty cycle, the foregoing measurement is repeated with A-data set to all zeros and B-input data is set to all ones (71f). More specifically, multiplexer 59 samples A-input data when the clock is high and B-input data when clock is low (71g). DAC 60 generates (71h) complementary analog square wave signals from the sampled data. (In this case, output 61 remains low for a longer period of time than when the clock is high if clock duty cycle errors are greater than 50% and output 62 remains high for a longer period of time than when the clock is low). Filters 64 and 65 filter (71i) the complementary analog square wave signals to produce filtered signals. These filtered signals are applied to the inputs 77, 78 of voltmeter 66. After the clock is allowed to toggle, and after filters 64 and 65 settle, voltmeter 66 measures (71j) the difference between the signals at inputs 77 and 78. This measurement is stored (e.g., in memory, not shown) as measurement M2.

Since M2 and M1 are measured with the same input data using the same DAC 60, they contain the same sources of duty cycle error. Process 71 obtains the difference between M1 and M2 and compares (71k) the difference to an acceptable limit. If the difference is less than the acceptable limit, the duty cycle of clock generator 67 is adjusted (71m) (e.g., by a controller) and the remainder of process 71 is repeated with the adjusted duty cycle until the difference between M1 and M2 is below the acceptable limit.

Following calibration, outputs 61, 62 of DAC 60 may be used to pass signals, such as test signals, to a DUT. At this point, i.e., where the difference between M1 and M2 is below the acceptable limit, first stage 56 need not be used to perform further calibration of DAC 60. However, during operation of tester 12, operational changes may affect the duty cycle of the clock signal. For example, a temperature change or a variation in the supply of power provided to the tester may introduce an error into the duty cycle of the clock signal. Second stage 57 is used to compensate (71L) for duty cycle errors that are introduced during operation of the tester.

As shown in FIG. 3, in this implementation, the circuitry that makes up second stage 57 (the tracking circuit) is identical to the circuitry of first stage 56, except that DAC 82 in second stage 57 is a one-bit DAC, not an n-bit DAC as in first stage 56. During operation of tester 12, input 84 of multiplexer 85 receives a zero-bit and input 86 of multiplexer 85 receives a one-bit. Multiplexer 85 samples the zero-bit and the one-bit using both the rising and falling edges of the clock signal (S). For example, multiplexer 85 samples the zero-bit at the rising clock edges and the one-bit at the falling clock edges.

As above, DAC 82 receives the output of multiplexer 85, and generates complementary first and second output signals. These output signals are analog, and are provided from DAC 82 to first and second filters 87 and 89, respectively. First filter 87 and second filter 89 are lowpass filters, which each produce an averaged output. First filter 87 produces an averaged output of the first signal, and second filter 89 produces an averaged output of the second signal (the complement of the first signal).

After the duty cycle calibration procedure of FIG. 4 has been performed, voltmeter 92 is measured. The resulting measurement is stored as measurement M3. During normal operation, temperature, supply voltage, or clock duty cycle changes can occur causing duty cycle errors to occur at outputs of DAC 60. Since DAC 82 is very similar to DAC 60 and receives the same clock, it will have the same resulting duty cycle errors. If there is a duty cycle error in the clock signal, then the outputs of DAC 82 will be skewed either high or low, resulting in complementary signals, which, when averaged by first filter 87 and second filter 89, do not have the same voltage level as measurement M3. A controller or other processing device, such as a DSP (not shown), may then adjust the duty cycle of the clock signal to compensate for, or substantially compensate for, the duty cycle error. The duty cycle may be adjusted until the output of voltmeter 92 reads M3.

The calibration process described herein can be implemented, at least in part, via a computer program product, i.e., a computer program tangibly embodied in an information carrier, e.g., in a machine-readable storage device or in a propagated signal, for execution by, or to control the operation of, data processing apparatus, e.g., a programmable processor, a computer, or multiple computers. A computer program can be written in any form of programming language, including compiled or interpreted languages, and it can 10 be deployed in any form, including as a stand-alone program or as a module, component, subroutine, or other unit suitable for use in a computing environment. A computer program can be deployed to be executed on one computer or on multiple computers at one site or distributed across multiple sites and interconnected by a network.

Actions associated with implementing the calibration process can be performed by one or more programmable processors executing one or more computer programs to perform the functions of the calibration process. All or part of the calibration process can be implemented as, special purpose logic circuitry, e.g., an FPGA (field programmable gate array) and/or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. Elements of a computer include a processor for executing instructions and one or more memory devices for storing instructions and data.

Circuitry to implement the calibration process is not limited to the specific examples described herein. For example, while this disclosure describes circuitry within ATE, the circuitry described herein may be used in any circuit environment requiring calibration of a DAC or other clock-dependent circuitry.

Elements of different embodiments described herein may be combined to form other embodiments not specifically set forth above. Other embodiments not specifically described herein are also within the scope of the following claims.

What is claimed is:

1. Circuitry comprising:
   a multiplexer to output first data and second data in response to a clock signal, the clock signal having rising and falling clock edges, the multiplexer outputting first data at a rising clock edge and outputting second data at a falling clock edge;
   a digital-to-analog converter (DAC) to receive the first data and the second data and to generate, therefrom, complementary first and second signals;
   filters to filter the complementary first signals and second signals and thereby produce first and second filtered signals;
   a voltmeter to measure a difference between the first and second filtered signals;
   wherein the first data initially has a first value and the second data initially has a second value resulting in the voltmeter measuring a first difference between the first and second filtered signals, and wherein the first data subsequently has the second value and the second data subsequently has the first value resulting in the voltmeter measuring a second difference between the first and second filtered signals; and
   a controller to adjust a duty cycle of the clock signal based on a difference between the first difference and the second difference.

2. The circuitry of claim 1, further comprising:
   clock generating circuitry to generate the clock signal;
   wherein the controller is configured to adjust the clock generating circuitry to substantially compensate for the duty cycle error.

3. The circuitry of claim 1, wherein the controller is configured to adjust the clock generating circuitry to change the duty cycle of the clock signal, the controller being configured to adjust the clock generating circuitry plural times in order to reduce the duty cycle error.

4. The circuitry of claim 3, wherein adjusting the clock generating circuitry plural times substantially compensates for errors in the duty cycle introduced by the DAC.

5. The circuitry of claim 1, wherein the filters comprise a lowpass filter.

6. The circuitry of claim 1, wherein the first data and the second data each comprises n-bit values, where n>1, that correspond to analog voltage levels.

7. Circuitry comprising:
   a multiplexer to output first data and second data in response to a clock signal, the clock signal having rising and falling clock edges, the multiplexer outputting first data at a rising clock edge and outputting second data at a falling clock edge;
   a digital-to-analog converter (DAC) to receive the first data and the second data and to generate, therefrom, complementary first and second signals;
   filters to filter the complementary first signals and second signals and thereby produce first and second filtered signals;
   a voltmeter to measure a difference between the first and second filtered signals, the difference being used to obtain to a duty cycle error in the clock signal; and
   a tracking circuit to:
   identify a second duty cycle error in the clock signal that was introduced as a result of a change in an operating condition associated with the circuitry; and substantially compensate for the second duty cycle error.

8. The circuitry of claim 7, wherein the tracking circuit comprises:
a multiplexer to output third data and fourth data in response to the clock signal, the multiplexer outputting third data at a rising clock edge and outputting fourth data at a falling clock edge;
a DAC to receive the third data and the fourth data and to output complementary third signals and fourth signals;
lowpass filters to filter the complementary third signals and fourth signals and thereby produce third and fourth filtered signals; and
a voltmeter to measure a difference between the third and fourth filtered signals, the difference corresponding to the second duty cycle error.

9. The circuitry of claim 8, wherein the third data comprises single-bit values having a first voltage level, and the fourth data comprises single-bit values having a second voltage level, the first and second voltage levels being different.

10. The circuitry of claim 7, wherein the operating condition comprises at least one of temperature and voltage applied to power the circuitry.

11. The circuitry of claim 7, wherein the first data initially has a first value and the second data initially has a second value resulting in the voltmeter measuring a first difference between the first and second filtered signals, and wherein the first data subsequently has the second value and the second data subsequently has the first value resulting in the voltmeter measuring a second difference between the first and second filtered signals; and
wherein the circuitry further comprises a controller to adjust a duty cycle of the clock signal based on a difference between the first difference and the second difference.

12. The circuitry of claim 11, further comprising:
clock generating circuitry to generate the clock signal;
wherein the controller is configured to adjust the clock generating circuitry to substantially compensate for the duty cycle error.

13. The circuitry of claim 12, wherein the controller is configured to adjust the clock generating circuitry to change the duty cycle of the clock signal, the controller being configured to adjust the clock generating circuitry plural times in order to reduce the duty cycle error.

14. The circuitry of claim 13, wherein adjusting the clock generating circuitry plural times substantially compensates for errors in the duty cycle introduced by the DAC.

15. A method of calibrating a digital-to-analog converter (DAC), the method comprising:
outputting first data and second data to the DAC in response to a clock signal having rising and falling clock edges, the first data being output at a rising clock edge and the second data being output at a falling clock edge;
generating complementary first signals and second signals via the DAC, the complementary first signals and second signals being generated based on the first and second data, respectively;
filtering the complementary first signals and second signals to produce first and second filtered signals;
obtaining a difference between the first and second filtered signals;
wherein the first data initially has a first value and the second data initially has a second value resulting in obtaining a first difference between the first and second filtered signals, and wherein the first data subsequently has the second value and the second data subsequently has the first value resulting in obtaining a second difference between the first and second filtered signals; and
adjusting a duty cycle of the clock signal based on a difference between the first difference and the second difference.

16. The method of claim 15, wherein the duty cycle is adjusted in order to reduce an error in the duty cycle.

17. The method of claim 16, the duty cycle is adjusted plural times in order to substantially compensate for the error in the duty cycle.

18. The method of claim 17, wherein adjusting the duty cycle plural times substantially compensates for errors in the duty cycle introduced by the DAC.

19. The method of claim 15, wherein filtering comprises lowpass filtering.

20. The method of claim 15, wherein the first data and the second data each comprises n-bit values, where n>1, that correspond to analog voltage levels.

21. A method of calibrating a digital-to-analog converter (DAC), the method comprising:
outputting first data and second data to the DAC in response to a clock signal having rising and falling clock edges, the first data being output at a rising clock edge and the second data being output at a falling clock edge;
generating complementary first signals and second signals via the DAC, the complementary first signals and second signals being generated based on the first and second data, respectively;
filtering the complementary first signals and second signals to produce first and second filtered signals;
obtaining a difference between the first and second filtered signals;
adjusting a duty cycle of the clock signal based on the difference;
identifying a second duty cycle error in the clock signal that was introduced as a result of a change in an operating condition associated with the method; and
substantially compensating for the second duty cycle error.

22. The method of claim 21, wherein identifying the second duty cycle error comprises:
outputting third data and fourth data in response to the clock signal, the multiplexer outputting third data at a rising clock edge and outputting fourth data at a falling clock edge;
generating complementary third signals and fourth signals based on the third data and the fourth data, respectively;
filtering the complementary third signals and fourth signals to thereby produce third and fourth filtered signals; and
measuring a difference between the third and fourth filtered signals, the difference corresponding to the second duty cycle error.

23. The method of claim 22, wherein the third data comprises single-bit values having a first voltage level, and the fourth data comprises single-bit values having a second voltage level, the first and second voltage levels being different.

24. The method of claim 21, wherein the operating condition comprises at least one of temperature and voltage applied to power the method.

25. The method of claim 21, wherein the first data initially has a first value and the second data initially has a second value resulting in the obtaining a first difference between the first and second filtered signals, and wherein the first data subsequently has the second value and the second data subsequently has the first value resulting in obtaining a second difference between the first and second filtered signals; and wherein the duty cycle of the clock signal is adjusted based on a difference between the first difference and the second difference.

26. The method of claim 25, wherein the duty cycle is adjusted in order to reduce an error in the duty cycle.

27. The method of claim 26, wherein the duty cycle is adjusted plural times in order to substantially compensate for the error in the duty cycle.

28. The method of claim 27, wherein adjusting the duty cycle plural times substantially compensates for errors in the duty cycle introduced by the DAC.

\* \* \* \* \*